(12) United States Patent
Kang et al.

(10) Patent No.: US 8,395,167 B2
(45) Date of Patent: Mar. 12, 2013

(54) EXTERNAL LIGHT EFFICIENCY OF LIGHT EMITTING DIODES

(75) Inventors: Xuejun Kang, Singapore (SG); Zhen Chen, Singapore (SG); Tien Khee Ng, Singapore (SG); Jenny Lam, Singapore (SG); Shu Yuan, Singapore (SG)

(73) Assignee: Tinggi Technologies Private Limited, Singapore (SG)

( * ) Notice: Subject to any disclaimer, the term of this patent is extended or adjusted under 35 U.S.C. 154(b) by 545 days.

(21) Appl. No.: 12/377,380

(22) PCT Filed: Aug. 16, 2007

(86) PCT No.: PCT/SG2007/000261
§ 371 (c)(1),
(2), (4) Date: Jul. 14, 2010

(87) PCT Pub. No.: WO2008/020819
PCT Pub. Date: Feb. 21, 2008

(65) Prior Publication Data
US 2010/0295014 A1    Nov. 25, 2010

(30) Foreign Application Priority Data
Aug. 16, 2006 (SG) ................. 200605500-8

(51) Int. Cl.
*H01L 33/00* (2010.01)
(52) U.S. Cl. .......................................... 257/95
(58) Field of Classification Search .......... 257/95
See application file for complete search history.

(56) References Cited

U.S. PATENT DOCUMENTS

| | | | |
|---|---|---|---|
| 3,897,627 A | 8/1975 | Klatskin | |
| 4,107,720 A | 8/1978 | Pucel et al. | |
| 5,192,987 A | 3/1993 | Khan et al. | |
| 5,405,804 A | 4/1995 | Yabe | |
| 5,654,228 A | 8/1997 | Shieh et al. | |
| 5,719,433 A | 2/1998 | Delage et al. | |
| 5,811,927 A | 9/1998 | Anderson et al. | |
| 5,879,862 A | 3/1999 | Roh | |
| 5,917,202 A | 6/1999 | Haitz et al. | |
| 5,948,281 A * | 9/1999 | Okazaki et al. ........... 216/26 |

(Continued)

FOREIGN PATENT DOCUMENTS

| | | |
|---|---|---|
| CN | 1373522 A | 10/2002 |
| EP | 1 061 590 A1 | 12/2000 |

(Continued)

OTHER PUBLICATIONS

Wada, O. "Ion-Beam etching of InP and its application to the fabrication of High Radiance InGaAsP/InP Light Emitting Diodes" J. Electrochem. Soc. 131, pp. 2373-2380 (1983.*

(Continued)

*Primary Examiner* — N Drew Richards
*Assistant Examiner* — Grant Withers
(74) *Attorney, Agent, or Firm* — Blakely, Sokoloff, Taylor & Zafman LLP

(57) ABSTRACT

A method to improve the external light efficiency of light emitting diodes, the method comprising etching an external surface of an n-type layer of the light emitting diode to form surface texturing, the surface texturing reducing internal light reflection to increase light output. A corresponding light emitting diode is also disclosed.

19 Claims, 5 Drawing Sheets

U.S. PATENT DOCUMENTS

| | | |
|---|---|---|
| 6,020,261 A | 2/2000 | Weisman |
| 6,091,085 A | 7/2000 | Lester |
| 6,117,784 A | 9/2000 | Uzoh |
| 6,169,297 B1 | 1/2001 | Jang et al. |
| 6,210,479 B1 | 4/2001 | Bojarczuk et al. |
| 6,259,156 B1 | 7/2001 | Kohno et al. |
| 6,303,405 B1 | 10/2001 | Yoshida et al. |
| 6,307,218 B1 | 10/2001 | Steigerwald et al. |
| 6,319,778 B1 | 11/2001 | Chen et al. |
| 6,365,429 B1 | 4/2002 | Kneissl et al. |
| 6,380,564 B1 | 4/2002 | Chen et al. |
| 6,420,242 B1 | 7/2002 | Cheung et al. |
| 6,420,732 B1 | 7/2002 | Kung et al. |
| 6,420,735 B2* | 7/2002 | Kim ............ 257/95 |
| 6,426,512 B1 | 7/2002 | Ito et al. |
| 6,448,102 B1 | 9/2002 | Kneissl et al. |
| 6,455,870 B1 | 9/2002 | Wang et al. |
| 6,492,661 B1* | 12/2002 | Chien et al. ............ 257/98 |
| 6,495,862 B1* | 12/2002 | Okazaki et al. ............ 257/103 |
| 6,509,270 B1 | 1/2003 | Held |
| 6,562,648 B1 | 5/2003 | Wong et al. |
| 6,573,537 B1* | 6/2003 | Steigerwald et al. ......... 257/103 |
| 6,586,875 B1 | 7/2003 | Chen et al. |
| 6,589,857 B2 | 7/2003 | Ogawa et al. |
| 6,627,921 B2 | 9/2003 | Wong et al. |
| 6,627,989 B2 | 9/2003 | Kohno et al. |
| 6,649,437 B1 | 11/2003 | Yang et al. |
| 6,677,173 B2 | 1/2004 | Ota |
| 6,784,460 B2* | 8/2004 | Ng et al. ............ 257/95 |
| 6,791,117 B2* | 9/2004 | Yoshitake et al. ............ 257/94 |
| 6,821,804 B2* | 11/2004 | Thibeault et al. ............ 438/29 |
| 6,927,423 B2* | 8/2005 | Sawaki et al. ............ 257/95 |
| 7,166,861 B2 | 1/2007 | Saito et al. |
| 7,250,320 B2* | 7/2007 | Okuyama et al. ............ 438/47 |
| 7,338,822 B2 | 3/2008 | Wu et al. |
| 7,339,197 B2* | 3/2008 | Lin et al. ............ 257/95 |
| 7,348,212 B2 | 3/2008 | Schiaffino et al. |
| 7,525,126 B2* | 4/2009 | Leatherdale et al. ............ 257/98 |
| 7,547,578 B2 | 6/2009 | Agarwal et al. |
| 7,683,386 B2* | 3/2010 | Tanaka et al. ............ 257/88 |
| 7,763,477 B2* | 7/2010 | Yuan et al. ............ 438/22 |
| 7,781,790 B2* | 8/2010 | Minato et al. ............ 257/98 |
| 7,804,101 B2* | 9/2010 | Niki et al. ............ 257/98 |
| 7,943,944 B2* | 5/2011 | Eisert et al. ............ 257/98 |
| 7,952,109 B2* | 5/2011 | Ng ............ 257/94 |
| 7,952,110 B2* | 5/2011 | Haase ............ 257/98 |
| 8,004,001 B2 | 8/2011 | Yuan et al. |
| 8,034,643 B2 | 10/2011 | Kang et al. |
| 8,067,269 B2 | 11/2011 | Yuan et al. |
| 8,124,994 B2 | 2/2012 | Yuan et al. |
| 2001/0055324 A1 | 12/2001 | Ota |
| 2002/0022286 A1* | 2/2002 | Nikolaev et al. ............ 438/46 |
| 2002/0034835 A1 | 3/2002 | Chen et al. |
| 2002/0093023 A1 | 7/2002 | Camras et al. |
| 2002/0113279 A1 | 8/2002 | Hanamaki et al. |
| 2002/0117681 A1 | 8/2002 | Weeks et al. |
| 2002/0134985 A1 | 9/2002 | Chen et al. |
| 2002/0137243 A1 | 9/2002 | Chen et al. |
| 2002/0179910 A1 | 12/2002 | Slater, Jr. |
| 2003/0038284 A1 | 2/2003 | Kurahashi et al. |
| 2003/0062530 A1* | 4/2003 | Okazaki et al. ............ 257/79 |
| 2003/0064535 A1 | 4/2003 | Kub et al. |
| 2003/0111667 A1 | 6/2003 | Schubert |
| 2003/0151357 A1 | 8/2003 | Uemura |
| 2003/0178626 A1* | 9/2003 | Sugiyama et al. ............ 257/79 |
| 2003/0189212 A1 | 10/2003 | Yoo |
| 2003/0189215 A1 | 10/2003 | Lee et al. |
| 2003/0218179 A1* | 11/2003 | Koide et al. ............ 257/95 |
| 2004/0026709 A1 | 2/2004 | Bader et al. |
| 2004/0031967 A1 | 2/2004 | Fudeta et al. |
| 2004/0033638 A1 | 2/2004 | Bader et al. |
| 2004/0065889 A1 | 4/2004 | Ueda et al. |
| 2004/0104395 A1 | 6/2004 | Hagimoto et al. |
| 2004/0110395 A1 | 6/2004 | Ueda et al. |
| 2004/0130037 A1 | 7/2004 | Mishra et al. |
| 2004/0144991 A1 | 7/2004 | Kikkawa |
| 2004/0164312 A1* | 8/2004 | Biwa et al. ............ 257/99 |
| 2004/0171183 A1* | 9/2004 | Kang et al. ............ 438/29 |
| 2004/0217362 A1 | 11/2004 | Slater, Jr. et al. |
| 2004/0235210 A1 | 11/2004 | Tamura et al. |
| 2005/0014303 A1* | 1/2005 | Tsai et al. ............ 438/29 |
| 2005/0026399 A1 | 2/2005 | Chien et al. |
| 2005/0035354 A1 | 2/2005 | Lin et al. |
| 2005/0082555 A1 | 4/2005 | Chien et al. |
| 2005/0087884 A1 | 4/2005 | Stokes et al. |
| 2005/0093002 A1 | 5/2005 | Tsai et al. |
| 2005/0098792 A1 | 5/2005 | Lee et al. |
| 2005/0127397 A1 | 6/2005 | Borges et al. |
| 2005/0142875 A1 | 6/2005 | Yoo |
| 2005/0145865 A1* | 7/2005 | Okuyama et al. ............ 257/98 |
| 2005/0164482 A1 | 7/2005 | Saxler |
| 2005/0173692 A1 | 8/2005 | Park et al. |
| 2005/0208435 A1 | 9/2005 | Chen et al. |
| 2006/0002442 A1 | 1/2006 | Haberern et al. |
| 2006/0006554 A1* | 1/2006 | Yoo et al. ............ 257/900 |
| 2006/0099730 A1 | 5/2006 | Lee et al. |
| 2006/0124939 A1* | 6/2006 | Lee et al. ............ 257/79 |
| 2006/0151801 A1 | 7/2006 | Doan et al. |
| 2006/0154389 A1 | 7/2006 | Doan |
| 2006/0154390 A1 | 7/2006 | Tran et al. |
| 2006/0154391 A1 | 7/2006 | Tran et al. |
| 2006/0154392 A1 | 7/2006 | Tran et al. |
| 2006/0154393 A1 | 7/2006 | Doan et al. |
| 2006/0157721 A1 | 7/2006 | Tran et al. |
| 2006/0163586 A1* | 7/2006 | Denbaars et al. ............ 257/79 |
| 2006/0186418 A1 | 8/2006 | Edmond et al. |
| 2007/0029541 A1* | 2/2007 | Xin et al. ............ 257/14 |
| 2007/0085098 A1* | 4/2007 | Erchak et al. ............ 257/95 |
| 2007/0187704 A1* | 8/2007 | Okuyama et al. ............ 257/95 |
| 2008/0105303 A1 | 5/2008 | Oswald et al. |
| 2008/0121908 A1 | 5/2008 | Yuan et al. |
| 2008/0164480 A1 | 7/2008 | Kang et al. |
| 2008/0210970 A1 | 9/2008 | Kang et al. |
| 2008/0265366 A1 | 10/2008 | Guo et al. |
| 2009/0068775 A1* | 3/2009 | Chang et al. ............ 438/29 |
| 2009/0078954 A1* | 3/2009 | Shim et al. ............ 257/98 |
| 2009/0127440 A1* | 5/2009 | Nakai ............ 250/227.2 |
| 2009/0267096 A1* | 10/2009 | Kim ............ 257/98 |
| 2010/0047996 A1 | 2/2010 | Yuan et al. |
| 2012/0001292 A1* | 1/2012 | Sasaki ............ 257/443 |

FOREIGN PATENT DOCUMENTS

| | | |
|---|---|---|
| EP | 1 139 409 A2 | 10/2001 |
| EP | 1 326 290 A2 | 7/2003 |
| EP | 1 502 284 A2 | 2/2005 |
| EP | 1 693 891 A2 | 8/2006 |
| JP | 50-074876 | 6/1975 |
| JP | 52-055480 | 5/1977 |
| JP | 59-112667 | 6/1984 |
| JP | 63-095661 | 4/1988 |
| JP | 04-078186 | 3/1992 |
| JP | 05-291621 | 11/1993 |
| JP | 07-326628 | 12/1995 |
| JP | 10-117016 | 5/1998 |
| JP | 2000-164928 | 6/2000 |
| JP | 2000-183400 | 6/2000 |
| JP | 2000-277804 | 10/2000 |
| JP | 2000-294837 | 10/2000 |
| JP | 2001-035974 | 2/2001 |
| JP | 2001-036129 | 2/2001 |
| JP | 2001-049491 | 2/2001 |
| JP | 2001-168094 | 6/2001 |
| JP | 2001-168387 | 6/2001 |
| JP | 2001-237461 | 8/2001 |
| JP | 2001-274507 | 10/2001 |
| JP | 2001-313422 | 11/2001 |
| JP | 2003-152138 | 5/2003 |
| JP | 2003-218383 | 7/2003 |
| JP | 2003-303743 | 10/2003 |
| JP | 2003-309286 | 10/2003 |
| JP | 2003-318443 | 11/2003 |
| JP | 2003-347590 | 12/2003 |
| JP | 2004-072052 | 3/2004 |
| JP | 2004-088083 | 3/2004 |
| JP | 2004-319552 | 11/2004 |
| JP | 2005-012188 | 1/2005 |
| JP | 2005-236048 | 9/2005 |

| | | |
|---|---|---|
| JP | 2005-260255 | 9/2005 |
| JP | 2005-286187 | 10/2005 |
| JP | 2006-253647 | 9/2006 |
| KR | 20010088931 | 9/2001 |
| KR | 10-0338180 | 5/2002 |
| KR | 10-2002-079659 | 10/2002 |
| KR | 20040058479 | 7/2004 |
| KR | 20040104232 | 12/2004 |
| SG | 200401424-7 | 3/2004 |
| SG | 200401964-2 | 4/2004 |
| SG | 200506301-1 | 9/2005 |
| SG | 200506897-8 | 10/2005 |
| SG | 200508210-2 | 12/2005 |
| SG | 200606050-3 | 9/2006 |
| TW | 419836 B | 1/2001 |
| TW | 475276 B | 2/2002 |
| TW | 540171 B | 7/2003 |
| WO | WO 01/47039 A1 | 6/2001 |
| WO | WO 03/088320 A2 | 10/2003 |
| WO | WO 2004/102686 A1 | 11/2004 |
| WO | WO 2005/029572 A1 | 3/2005 |
| WO | WO 2005/029573 A1 | 3/2005 |
| WO | WO 2005/062745 A2 | 7/2005 |
| WO | WO 2005/064666 A1 | 7/2005 |
| WO | WO 2005/088743 A1 | 9/2005 |
| WO | WO 2005/096365 A1 | 10/2005 |
| WO | WO 2005/098974 A1 | 10/2005 |
| WO | WO 2005/104780 A2 | 11/2005 |
| WO | WO 2007/046773 A1 | 4/2007 |
| WO | WO 2007/037762 A1 | 5/2007 |
| WO | WO 2007/073354 A1 | 6/2007 |
| WO | WO 2008/030188 A1 | 3/2008 |

OTHER PUBLICATIONS

M.K. Kelly, et al., "Optical Process for Liftoff of Group III-Nitride Films," Physica Status Solidi (a), vol. 159, Issue 1, pp. R3-R4, (Nov. 28, 1996).

Tetsuzo Ueda, et al., "Vertical InGaN-Based Blue Light Emitting Diode with Plated Metal Base Fabricated using Laser Lift-Off Technique," Physica Status Solidi (c), vol. 0, Issue 7, pp. 2219-2222, (Oct. 20, 2003).

Chen-Fu Chu, et al., "Comparison of p-Side Down and p-Side Up GaN Light-Emitting Diodes Fabricated by Laser Lift-Off", Japan Journal of Applied Physics, vol. 42, Part 2, No. 2B, pp. L147-L150, (Feb. 15, 2003).

W.H. Li, et al., "Electrochemical Deposition of Copper on Patterned Cu/Ta(N)SiO2 Surfaces for Super Filling of Sub-Micron Features", Journal of Applied Electrochemistry, vol. 31, pp. 1395-1397, (Aug. 20, 2001).

Zhifang Fan, et al., "Very Low Resistance Multilayer Ohmic Contact to n-Gan," Applied Physics Letters, vol. 68, Issue 12, pp. 1672-1674, (Mar. 18, 1996).

I. Schnitzer, et al., "30% External Quantum Efficiency from Surface Textured, Thin-Film Light-Emitting Diodes," Applied Physics Letters, vol. 63, Issue 16, pp. 2174-2176, (Oct. 18, 1993).

Shyi-Ming Pan, et al., "Improvement of InGaN-GaN Light-Emitting Diodies with Surface-Textured Indium-Tin-Oxide Transparent Ohmic Contacts," IEEE Photonics Technology Letters, vol. 15, Issue 5, pp. 649-651, (May 2003).

Chul Huh, et al., "Improved Light-Output and Electrical Performance of InGaN-Based Light-Emitting Diode by Microroughening of the p-GaN Surface," Journal of Applied Physics, vol. 93, Issue 11, pp. 9383-9385, (Jun. 1, 2003).

F.A. Kish, et al., "Very High-Efficiency Semiconductor Wafer-Bonded Transparent-Substrate $(Al_xGa_{1-x})_{0.5}In_{0.5}P/GaP$ Light-Emitting Diodes," Applied Physics Letters, vol. 64, Issue 21, pp. 2839-2841, (May 23, 1994).

R.H. Horng, et al., "AlGaInP Light-Emitting Diodes with Mirror Substrates Fabricated by Wafer Bonding," Applied Physics Letters, vol. 75, Issue 20, pp. 3054-3056, (Nov. 15, 1999).

H. Sugawara, et al., "Characteristics of a Distributed Bragg Reflector for the Visible-Light Spectral Region using InGaAlP and GaAs: Comparison of Transparent- and Loss-Type Structures," Journal of Applied Physics, vol. 74, Issue 5, pp. 3189-3193, (Sep. 1, 1993).

PCT International Search Report for PCT Application No. PCT/SG2003/000222 containing Communication relating to the Results of the Partial International Search Report, 3 pgs., (Dec. 9, 2003).

PCT International Search Report for PCT Application No. PCT/SG2003/000223 containing Communication relating to the Results of the Partial International Search Report, 3 pgs., (Dec. 9, 2003).

PCT International Search Report for PCT Application No. PCT/SG2005/000061 containing Communication relating to the Results of the Partial International Search Report, 2 pgs., (May 12, 2005).

PCT International Search Report for PCT Application No. PCT/SG2005/000062 containing Communication relating to the Results of the Partial International Search Report, 2 pgs., (May 12, 2005).

PCT International Search Report for PCT Application No. PCT/SG2006/000254 containing Communication relating to the Results of the Partial International Search Report, 4 pgs., (Nov. 16, 2006).

PCT International Search Report for PCT Application No. PCT/SG2006/000255 containing Communication relating to the Results of the Partial International Search Report, 3 pgs., (Nov. 6, 2006).

PCT International Search Report for PCT Application No. PCT/SG2006/000395 containing Communication relating to the Results of the Partial International Search Report, 3 pgs., (Feb. 26, 2007).

PCT International Search Report for PCT Counterpart Application No. PCT/SG2005/000261 containing Communication relating to the Results of the Partial International Search Report, 3 pgs., (Oct. 12, 2007).

PCT International Search Report for PCT Application No. PCT/SG2007/000288 containing Communication relating to the Results of the Partial International Search Report, 3 pgs., (Nov. 9, 2007).

PCT International Preliminary Report on Patentability for PCT Counterpart Application No. PCT/SG2007/000261, 9 pgs., (Mar. 17, 2008).

PCT Written Opinion of the International Searching Authority for PCT Counterpart Application No. PCT/SG2007/000261, 6 pgs., (Oct. 12, 2007).

Supplementary European Search Report for European Application No. 05711220.3-2222, 3 pgs., (Nov. 30, 2010).

Supplementary European Search Report for European Application No. 06784267.4-1235, 4 pgs., (Feb. 4, 2011).

Supplementary European Search Report for European Application No. 03818739, 1 pg., (Jan. 19, 2011).

Written Opinion for Chinese Patent Application No. 3827175.3, 6 pgs., (May 23, 2011).

* cited by examiner

EXTERNAL LIGHT EFFICIENCY OF LIGHT EMITTING DIODES

CROSS REFERENCE TO RELATED APPLICATIONS

This patent application is a U.S. National Phase application under 35 U.S.C. §371 of International Application No. PCT/SG2007/000261, filed on Aug. 16, 2007, entitled IMPROVEMENTS IN EXTERNAL LIGHT EFFICIENCY OF LIGHT EMITTING DIODES, which claims priority to Singapore patent application number 200605500-8, filed Aug. 16, 2006.

FIELD OF THE INVENTION

This invention relates to improvements in external light efficiency of light emitting diodes and refers particularly, though not exclusively, to light emitting diodes with surface texturing, include micro-lenses and/or surface roughening, on a light output surface, and a method of such surface texturing on a light output surface of light emitting diodes.

BACKGROUND OF THE INVENTION

Ga—N-based light emitting diodes (LEDs) have been intensively studied and developed in recent years. High efficiency, high power, GaN-based LEDs have attracted interest for applications such as displays, traffic signals, back lighting for mobile/cellular telephones and similar apparatus, and white light sources. Reducing cost and improving light output efficiency are important factors to enable such GaN LEDs to succeed in the mainstream lighting market.

In general, the internal quantum efficiency ($\eta_i$) for GaN-based LEDs is significantly less than 100% due to crystal quality and epitaxial layer structure. A typical ($\eta_i$) can reach about 70 to 80%. Further improvement has proven difficult to achieve. The external quantum efficiency ($\eta_{ext}$) is still much lower than internal quantum efficiency. This is because the light extraction efficiency of conventional GaN-based LEDs is limited by total internal light reflection, which occurs at the semiconductor-air interface due to the high refractive index of GaN (n≈12.5) compared to air (n=1). The critical angle for the light generated in the active region is only about 23°. Most of the light generated is repeatedly reflected into the substrate and eventually absorbed. Assuming that light emitted from sidewalls and the bottom is neglected, only a small fraction (4%) can be extracted from the surface.

Conventional GaN-based LEDs grown by metalorganic chemical vapor deposition (MOCVD) use a nonconductive sapphire substrate. The epitaxial layers on the sapphire substrate consists of usually a light-generating layer (active region) sandwiched between a relatively thick n-type doped GaN layer and relatively thin p-type doped GaN layer. The n-type GaN layer is formed by a stack of multiple layers (undoped or doped to n-type semiconductor made of GaN related materials like GaN, AlGaN, or InGaN, or AlGaInN, etc.) on the sapphire, while the p-type GaN layer is formed by a stack of multiple layers (undoped or doped to p-type semiconductor made of GaN related materials like GaN, AlGaN, or InGaN, or AlGaInN, etc.) away from the sapphire. The top p-GaN surface epitaxial layer is Ga-Polar which is often used as light extraction surface. The poor thermal conductivity of the sapphire substrate, and the relatively high current densities, combine to degrade the device performance due to excessive heating from the active layer during operation. At the same time, the relatively thin p-GaN layer (usually less than 0.5 micrometer) and the high resisitivity of p-GaN, is highly sensitive to plasma damaging and is difficult to use for dry surface texturing. Furthermore, Ga-polar GaN is chemically inert and is more difficult to wet etch than N-polar GaN. The other side of the active region, i.e., the n-GaN layer of the active region is usually much thicker (2 to 5 micrometers thick) than the p-type GaN layer, and is ideal for making surface texturing due to its thickness. However, this part is below the active region and on the sapphire. It is not able to be surface textured unless the sapphire is removed.

To address these problems, vertical laser liftoff of GaN LEDs and other methods have been developed to detach the sapphire from the GaN epitaxial films grown on it. Flip-chip or other bonding technologies have also been developed to attach the GaN films to a new substrate with good thermal conductivity. Different surface roughening techniques on exposed LED N-polar n-GaN surface have also been developed, including ICP plasma etching and wet etching.

The formation of micro-lenses on an output surface of a light emitting diode has been proposed. However, in the main it is not possible as the active region is close to the light emitting surface on the p-type GaN layer and the forming of the micro-lenses or surface roughing may damage the active region.

SUMMARY OF THE INVENTION

In accordance with a first preferred aspect there is provided a method to improve the external light efficiency of light emitting diodes, the method comprising etching an external surface of an n-type layer of the light emitting diode to form surface texturing, the surface texturing reducing internal light reflection to increase light output.

According to a second preferred aspect, there is provided a light emitting diode comprising an external surface of an n-type layer of the light emitting diode having surface texturing formed by etching, the surface texturing being for reducing internal light reflection for increasing light output and external light efficiency of the light emitting diode.

According to a third preferred aspect, there is provided a light emitting diode comprising an external surface of an n-type layer of the light emitting diode, and layer of another material being formed on an external surface of the n-type layer, an outermost layer of the layer of another material being surface textured for reducing internal light reflection for increasing light output and external light efficiency of the light emitting diode.

For all aspects the active layer may comprise of one or more of: a quantum well, quantum wells, quantum dots, and quantum wires. The surface texturing may be by wet etching with a chemical solution. The chemical solution may be an aqueous solution of potassium hydroxide at an elevated temperature for a predetermined period. Agitation of the light emitting diode may be used during the etching. The agitation may be by ultraviolet illumination. Additionally or alternatively, the surface texturing may be by dry etching. The dry etching may be plasma etching, plasma bombardment or laser processing. The dry etching may be before or after the wet etching.

The surface texturing may be at least one of: surface roughening, micro-lenses, and surface roughened micro-lenses, holes, voids, pillars and vias. The micro-lenses may be selected from: hemispherical, substantially hemispherical, hemispherical with a flat top, a segment of a sphere, pyramidicial, cylindrical, and cuboid. The micro-lenses may be of:

(a) a spacing between the micro-lenses in the range 2 to 3 μm;
(b) a pitch of substantially 6 μm; and
(c) a radius of substantially 2 μm.

The micro-lenses may be substantially pyramidical and may have facets at an angle of substantially 58°. The surface texturing may be over a part of the external surface. The surface texturing may be in light spaces formed between joining portions and an outer portion of a current dissipation array on the external surface.

A first ohmic contact may be formed on the external surface of the n-type layer and a second ohmic contact may be formed on p-type layer external surface. The second ohmic contact may reflect light for enhancing light emission of the light emitting diode. The second ohmic contact may comprise a stack of multiple layers of metals and their alloys. The metal may be silver, aluminum or another highly reflective metal. The highly reflective metal may be for a light reflection layer for enhancing light reflection of the light emitting diode. The second ohmic contact may cover the entire p-type layer external surface. Alternatively, the second ohmic contact may cover a portion of the p-type layer external surface, with the remainder of the p-type layer external surface being at least partially covered with at least one reflective material for reflecting light for enhancing light emission of the light emitting diode.

The p-type layer, the active layer and the n-type layer may be of one or more of a GaN-related material such as, for example, GaN, InGaN, AlGaN, AlGaInN, InN and AlN.

Surface texturing may also be on the p-type side by surface texturing at least one layer selected from: the p-type layer, the ohmic contact layer, and the contact layer.

BRIEF DESCRIPTION OF THE DRAWINGS

In order that the present invention may be fully understood and readily put into practical effect, there shall now be described by way of non-limitative example only preferred embodiments of the present invention, the description being with reference to the accompanying illustrative drawings.

In the drawings.

DETAILED DESCRIPTION OF THE PREFERRED EMBODIMENTS

Figure 1:
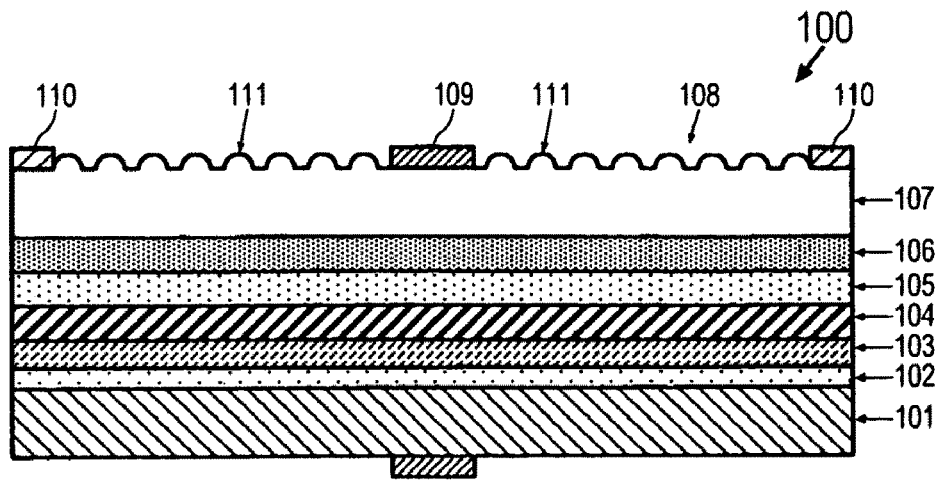
FIG. 1 is a vertical cross-sectional view of a first preferred embodiment.

To refer to FIGS. 1 to 4 there is shown a first preferred embodiment being a light emitting diode 100 having:

a first contact layer 101 of conductive metal;
a seeding layer 102, a reflective layer 103;
an ohmic contact layer 104;
a p-type material layer 105 such as, for example, GaN;
a plurality of epitaxial layers forming an active layer 106; and
a conductive layer 107 of n-type material such as, for example, GaN.

Any layer may be a stack of multiple layers. The n-type layer 107 is relatively thick, whereas the p-type layer 105 is relatively thin. The active layer 106 may be one or more of: a quantum well, quantum wells, quantum dots and quantum wires.

The conductive layer 107 is for the transmission of light generated in the active layer 106, the light passing through an external light output surface 108 of conductive layer 107. The external surface 108 is the external surface of the air-n-GaN interface. A bonding pad 109 is formed on the external surface 108. A current dissipation array 110 may also be formed on the external surface 108.

The external surface is surface textured to improve external light efficiency by reducing total internal reflection. Surface texturing may be by one or more of surface roughening, micro-lenses, surface roughened micro-lenses, holes, voids, pillars, and vias. One way of surface texturing is to etch the external surface 108 to form a plurality of micro-lenses 111 from external surface 108. The micro-lenses 111 are preferably hemispherical or close to hemispherical. However, they may be of any other suitable shape such as, for example, hemispherical with a flat top, a segment of a sphere, pyramidical, cylindrical, cuboid, and so forth.

The micro-lenses 111 may be of any suitable size and spacing. For example, the spacing between the micro-lenses 111 may be of the order of 2 or 3 μm; the pitch (the spacing between centres of adjacent micro-lenses 111) may be of the order of about 6 μm; and each micro-lenses may have a radius of the order of about 2 μm.

Figure 2:
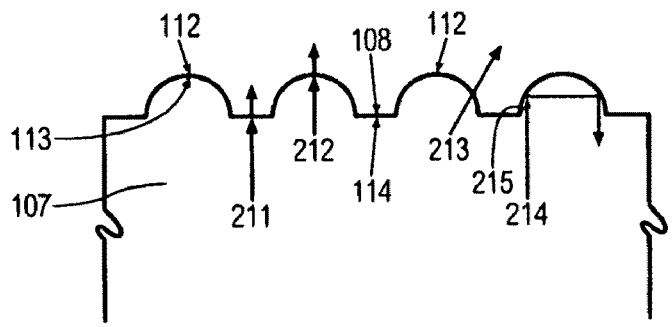
FIG. 2 is an enlarged view of a part of FIG. 1.
Figure 3:
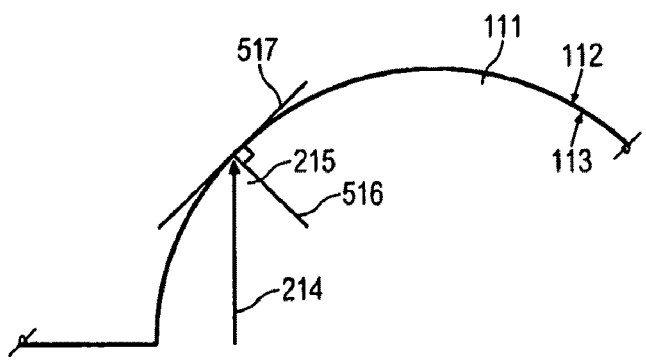
FIG. 3 is an enlarged view of the right-hand end of FIG. 2.

As shown on FIGS. 2 and 3, arrows 211, 212 and 213 represent light generated in active layer 106 and passing through layer 107. The majority of the light will pass into micro-lenses 111 or will be incident upon the internal surface 114 of the air/GaN interface. When the angle of incidence of a light beam 211, 212, 213 contacting the internal surface 114 between micro-lenses 111, or the inner surface 113 of micro-lenses 111, at an angle 215 less than the critical angle the light will pass through inner surface 113 and internal surface 114 and will thus be output from the LED 100. If the angle 215 is greater than the critical angle, the light will be reflected by inner surface 113 and internal surface 114. The angle 215 is the angle between the incident light beam 214 and a line 516 perpendicular to a tangent 517 at the point where beam 214 is incident upon surface 113, 114. The critical angle is when angle 215 is such that light beam 214 is reflected by inner surface 113 or internal surface 114 rather than passing through inner surface 113 or internal surface 114 respectively. The critical angle will depend on the material of n-GaN layer 107 and the wavelength of the light 214. If the angle 215 is 0°, the beam 214 will pass through inner surface 113 or internal surface 114 unaffected. If the angle 215 is between the critical angle and 0°, the beam 214 will pass through inner surface 113 or internal surface 114 but may be refracted. A likely range for the angle 215 is 20 to 35°. As noted earlier, for most n-GaN materials and LEDs, the critical angle is about 23°.

Therefore, by controlling the material, size, shape and spacing of micro-lenses 111 it is possible to control the direction and extent of light output from the light emitting diode 100. This may be to the extent that LED 100 could output a focused beam of light.

Figure 4:
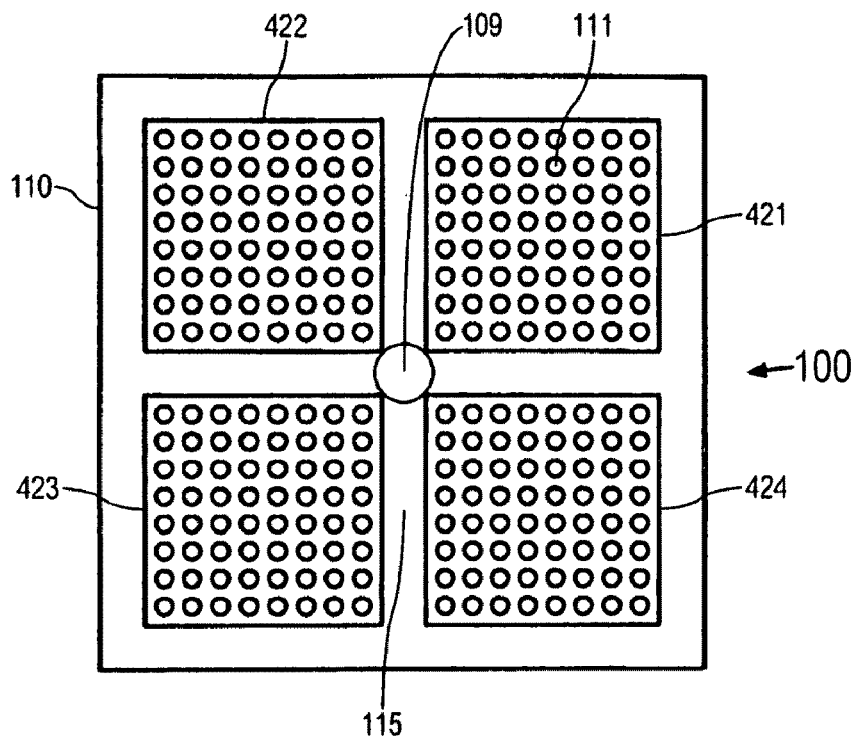
FIG. 4 is a top plan view of the embodiment of FIG. 1.
Figure 5:
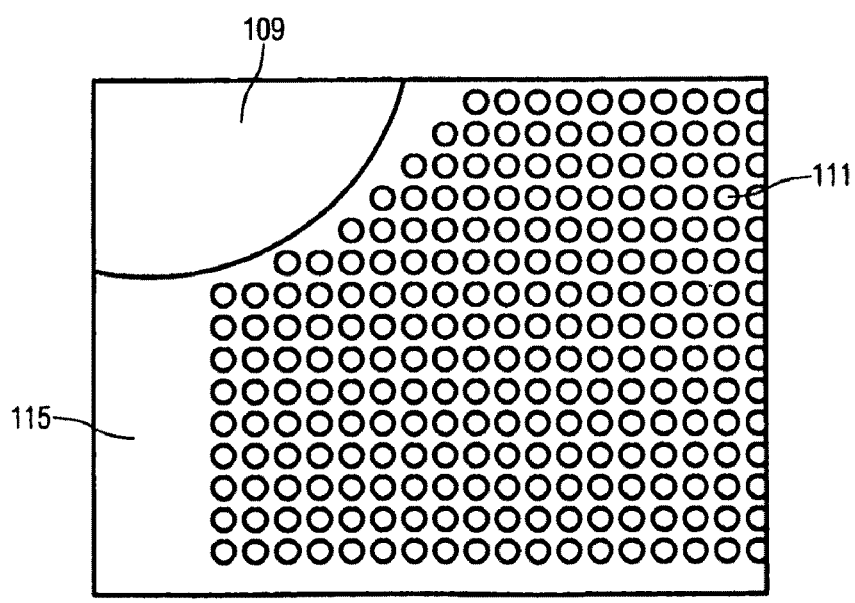
FIG. 5 is a photomicrograph of a portion of a light emitting device according to the first preferred embodiment.
Figure 11:
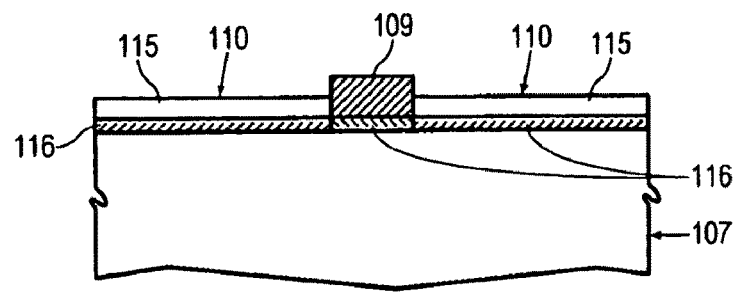
FIG. 11 is an enlarged side view of a fourth preferred embodiment.

FIGS. 4 and 11 show the arrangements of the microlenses 111 in a current dissipation array 109, 110 on the external surface 108. The nature, purpose and construction of array 109,110 is fully disclosed in co-pending Singapore, patent application number 200606050-3 dated Sep. 4, 2006 entitled "Electrical Current Distribution in Light Emitting Devices" and granted as SG 140512; the contents of which are incorporated herein by reference as if disclosed herein in its entirety.

The array 109, 110 comprises an outer portion 110 connected to the bonding pad 109 by joining portions 115. Between joining portions 115 and outer portion 110 are a number of light spaces 421, 422, 423 and 424 in which the micro-lenses 111 are located. The light spaces 421, 422, 423 and 424 may each be of substantially the same size and shape, or may different. The number of micro-lenses 111 in each light space 421, 422, 423 and 424, and how they are arrayed, may be the same, or may differ from one light space to the next. A reflective layer 116 may be formed under or within array 109, 110.

The microlens can be formed by etching part of the semiconductor LED. First, photoresist is spun onto the surface, and then patterns are formed on the resist by standard photolithography. These photoresist patterns act as subsequent etching mask for microlens formation. Instead of the photoresist, other materials can also be used as an etching mask. After etching and removal of any residual photoresist, the microlens is formed.

Figure 6:
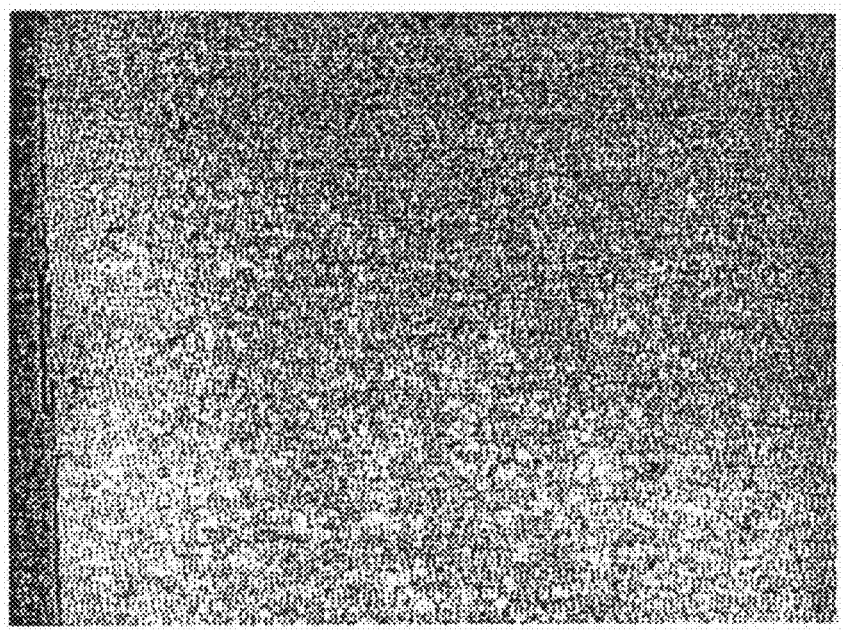
FIG. 6 is a scanning electron microscope image of a second preferred embodiment.
Figure 7:
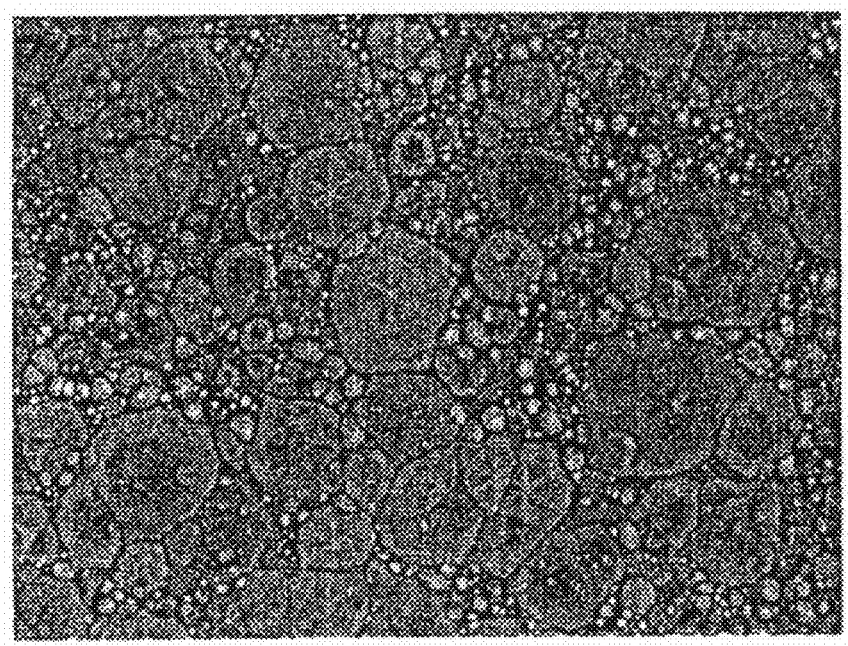
FIG. 7 is a more detailed image of a portion of FIG. 6.

In a second embodiment the surface texturing is surface roughening formed by crystallographic wet etching of all or part of external surface 108. This is by subjecting the n-GaN surface 108 to aqueous potassium hydroxide etching at a temperature such as, for example, room temperature to 200 C for a predetermined period. The period may be as small as a few seconds up to several hours. For example, the temperature may be 90° C. and the predetermined period may be 7 minutes. The aqueous potassium hydroxide solution may be a 2 Mole potassium hydroxide solution, but other concentrations may be used. FIG. 6 shows that the surface 108 is roughened with small grains and FIG. 7 shows that the surface morphology of the n-GaN surface 108 displays a high level of roughness at the sub-micron scale with a dense, hexagonal pyramid structure being formed. The facets of the pyramids are in planes inclined at about 58° 4°.

Agitation of the light emitting diode may be used during the etching. The agitation may be by ultraviolet illumination. Additionally or alternatively, the surface texturing may be by dry etching. The dry etching may be plasma etching, plasma bombardment or laser processing. The dry etching may be before or after the wet etching.

Such dense nanotip pyramidical structures can be used as nanolenses to increase the light extraction efficiency of GaN-based LEDs. As shown in FIG. 7, some of the large pyramids were broken and new small pyramids tips were formed on the top of them. The new, small pyramids grow with time. In such way, the etching of the n-GaN surfaced 108 can continue.

Figure 8:
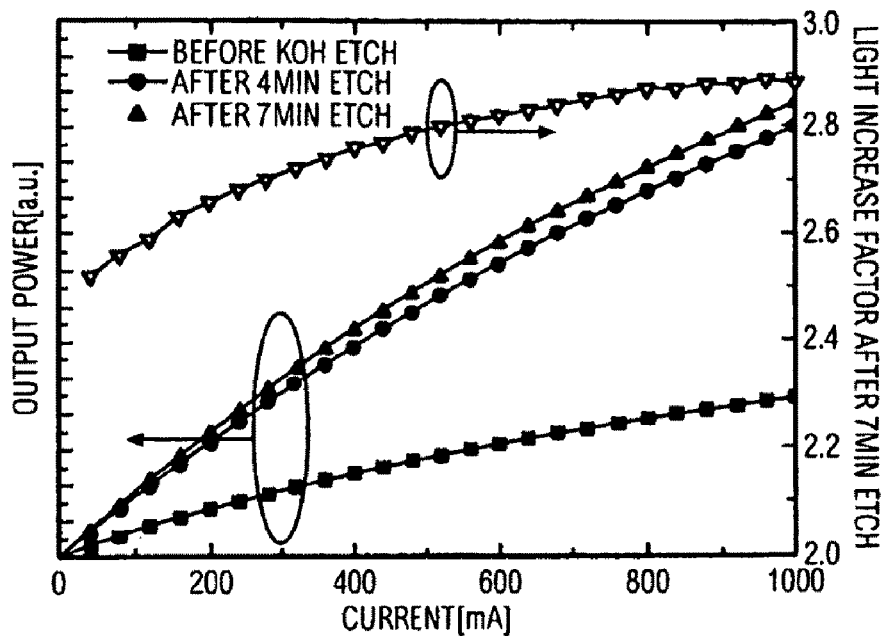
FIG. 8 is a graph of L-I characteristics for different etching times.

FIG. 8 shows the electrical luminescence ("EL") output power from surface 108 versus the injection current (L-I) with different etching times. The data was obtained from the same LED dies before and after KOH wet etching and measured on the wafer before dicing, so that any factor other than the surface morphology could be neglected. The output power at a given current increased significantly after surface roughening. After 7 minutes of KOH etching, the light output power increased by a factor of 2.5 to 3.

Figure 9:
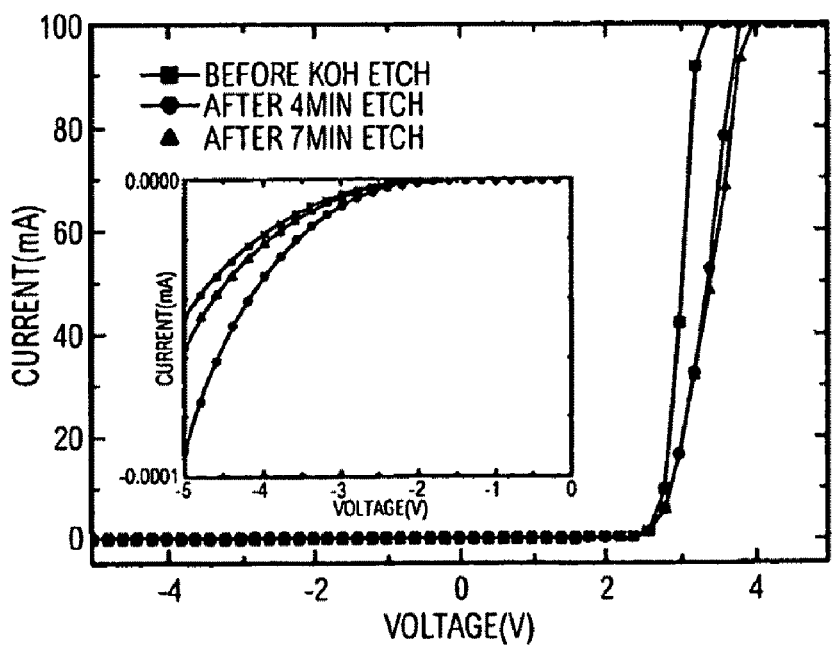
FIG. 9 is a graph of I-V characteristics for different etching times.

FIG. 9 shows a comparison of the measured I-V characteristic before and after KOH etching. The degradation of forward voltage drop $(V_f)$ after KOH etching is mainly due to N-metal deterioration. The aluminum inside the Ti/Al/Ti/Au N-metal will slowly deteriorate during KOH etching. This problem may be solved by depositing N-metal after surface roughening. The reverse leakage current does not degrade with the increase of etching time.

Figure 10:
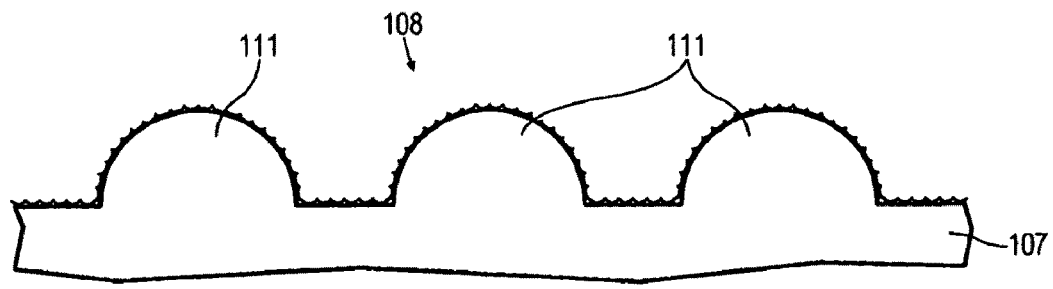
FIG. 10 is an enlarged side view of a third preferred embodiment.

FIG. 10 shows a third preferred embodiment which is a combination of surface roughening 1001 on the outside surface 112 of micro lenses 111. The surface roughening 1001 may be over all or part of surface 108 and/or all or part of micro lenses 111. In this way the n-GaN surface 108 may have an untreated surface and/or a surface roughened 1001 surface and/or micro lenses 111 and/or micro lenses 111 with surface roughening 1001.

Figure 12:
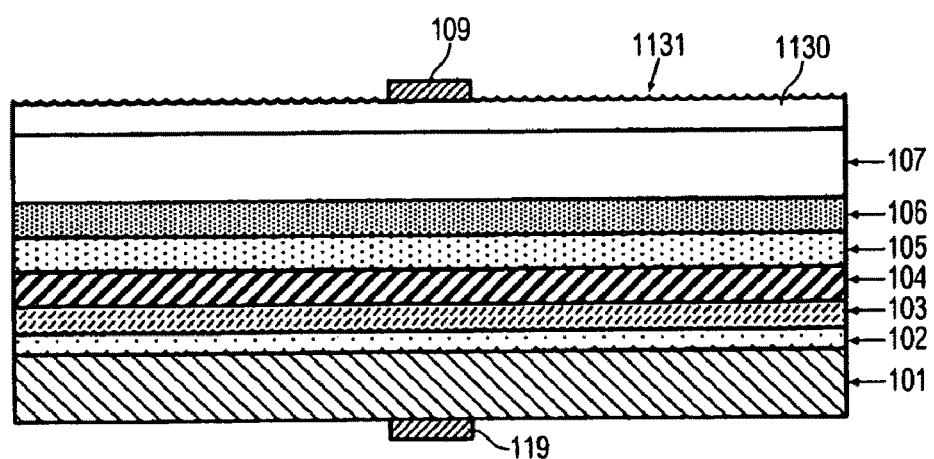
FIG. 12 is an enlarged side view of a fifth preferred embodiment.

As shown in FIG. 12, a layer 1130 of another material may be formed on the external surface 108 of the n-type layer. This may be before or after the surface is surface textured. An outermost surface 1131 of the layer of another material is surface textured for reducing internal light reflection for increasing light output and external light efficiency of the light emitting diode. Surface texturing may be as described above.

The ohmic contact layer 104 is formed on the external surface of the p-type layer 105. The ohmic contact 104 may reflect light for enhancing light emission of the light emitting diode. The ohmic contact layer 104 may comprise a stack of multiple layers of metals and their alloys. The metal may be silver, aluminum or another highly reflective metal. The highly reflective metal may be for a light reflection layer for enhancing light reflection of the light emitting diode. The second ohmic contact layer 104 may cover the entire external surface of the p-type 105. Alternatively, the ohmic contact layer 104 may cover a portion of the external surface of the p-type layer 105, with the remainder of the external surface of the p-type layer 105 being at least partially covered with at least one reflective material for reflecting light for enhancing light emission of the light emitting diode.

The p-type layer 105, the active layer 106 and the n-type layer 107 may be of one or more of a GaN-related material such as, for example, GaN, InGaN, AlGaN, AlGaInN, InN and AlN.

In addition to the surface texturing on the n-type layer 107, surface texturing may be performed on the p-type side. This may be on p-type layer 105 and/or contact layer 101 and/or ohmic contact layer 104.

Whilst there has been described in the foregoing description preferred embodiments of the present invention, it will be understood by those skilled in the technology concerned that many variations or modifications in details of design or construction may be made without departing from the present invention.

What is claimed is:

1. A method to improve the external light efficiency of a light emitting diode, the light emitting diode including an n-type layer, a p-type layer, an ohmic contact layer, and a contact layer, the method comprising:
    etching an external surface of the n-type layer to form surface texturing, the surface texturing reducing internal light reflection to increase light output,
    wherein the surface texturing is at least one selected from the group consisting of: micro-lenses and surface roughened micro-lenses, and wherein the surface texturing is over a part of the external surface of the n-type layer and is in light spaces formed between joining portions and an outer portion of a current dissipation array on the external surface of the n-type layer.

2. The method as claimed in claim 1, wherein the light emitting diode has an active layer between the n-type layer and the p-type layer and the active layer comprises at least one selected from the group consisting of: a quantum well, quantum wells, quantum dots, and quantum wires.

3. The method as claimed in claim 1, wherein the surface texturing is formed by wet etching with an aqueous solution of potassium hydroxide at a temperature for a predetermined period.

4. The method as claimed in claim 1, further comprising: agitating the light emitting diode with ultraviolet illumination during the etching.

5. The method as claimed in claim 1, wherein the etching is dry etching, the dry etching being at least one selected from the group consisting of: plasma etching, plasma bombardment, or laser processing; and the dry etching being performed before or after wet etching.

6. The method as claimed in claim 1, wherein the micro-lenses are selected from the group consisting of: hemispherical, substantially hemispherical, hemispherical with a flat top, a segment of a sphere, pyramidical, cylindrical, and cuboid; and the micro-lenses are of:
   (a) a spacing between the micro-lenses in the range 2 to 3 µm;
   (b) a pitch of substantially 6 µm; and
   (c) a radius of substantially 2 µm.

7. The method as claimed in claim 2, wherein a first ohmic contact is formed on the external surface of the n-type layer and a second ohmic contact is formed on a surface of the p-type layer, the second ohmic contact configured to reflect light to enhance light emission of the light emitting diode and comprising a stack of multiple layers of metals and their alloys, at least one of the metals being a highly reflective metal including at least one of: silver and aluminum, the highly reflective metal serving as a light reflection layer to enhance light reflection of the light emitting diode.

8. The method as claimed in claim 7, wherein the second ohmic contact covers the surface of the p-type layer entirely.

9. The method as claimed in claim 7, wherein the second ohmic contact covers a portion of the surface of the p-type layer, with the remainder of the surface of the p-type layer being at least partially covered with at least one reflective material, the at least one reflective material reflecting light to enhance light emission of the light emitting diode.

10. The method as claimed in claim 2, wherein the p-type layer, the active layer, and the n-type layer are at least one selected from the group consisting of: a GaN-related material, GaN, InGaN, AlGaN, AlGaInN, InN and AlN.

11. The method as claimed in claim 1 further comprising:
   forming surface texturing on at least one layer selected from the group consisting of: the p-type layer, the ohmic contact layer, and the contact layer.

12. A light emitting diode comprising:
   an n-type layer having surface texturing over a part of an external surface of the n-type layer to reduce internal light reflection and increasing light output and external light efficiency of the light emitting diode,
   wherein the surface texturing is formed by etching and is at least one selected from the group consisting of: micro-lenses and surface roughened micro-lenses, and
   wherein the surface texturing is in light spaces formed between joining portions and an outer portion of a current dissipation array on the external surface of the n-type layer.

13. The light emitting diode as claimed in claim 12, further comprising:
   a p-type layer; and
   an active layer between the n-type layer and the p-type layer, the active layer comprising at least one selected from the group consisting of: a quantum well, quantum wells, quantum dots, and quantum wires.

14. The light emitting diode as claimed in claim 12, wherein the micro-lenses are selected from the group consisting of: hemispherical, substantially hemispherical, hemispherical with a flat top, a segment of a sphere, pyramidicial, cylindrical, and cuboid; and the micro-lenses are of:
   (a) a spacing between the micro-lenses in the range 2 to 3 µm;
   (b) a pitch of substantially 6 µm; and
   (c) a radius of substantially 2 µm.

15. The light emitting diode as claimed in claim 13, wherein a first ohmic contact is formed on the external surface of the n-type layer and a second ohmic contact is formed on a surface of the p-type layer, the second ohmic contact configured to reflect light to enhance light emission of the light emitting diode and comprising a stack of multiple layers of metals and their alloys, at least one of the metals being a highly reflective metal including at least one of: silver and aluminum; the highly reflective metal serving as a light reflection layer to enhance light reflection of the light emitting diode.

16. The light emitting diode as claimed in claim 15, wherein the second ohmic contact covers the surface of the p-type layer entirely.

17. The light emitting diode as claimed in claim 15, wherein the second ohmic contact covers a portion of the surface of the p-type layer, with the remainder of the surface of the p-type layer being at least partially covered with at least one reflective material, the at least one reflective material reflecting light to enhance light emission of the light emitting diode.

18. The light emitting diode as claimed in claim 13, wherein the p-type layer, the active layer, and the n-type layer are at least one selected from the group consisting of: a GaN-related material, GaN, InGaN, AlGaN, AlGaInN, InN and AlN.

19. The light emitting diode as claimed in claim 13, further comprising:
   surface texturing on at least one layer selected from the group consisting of: the p-type layer, the ohmic contact layer, and the contact layer.

\* \* \* \* \*